(12) United States Patent
Oda

(10) Patent No.: US 6,655,967 B2
(45) Date of Patent: Dec. 2, 2003

(54) ELECTRICAL CONNECTOR HOUSING

(75) Inventor: Akihiro Oda, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 0 days.

(21) Appl. No.: 09/922,796

(22) Filed: Aug. 7, 2001

(65) Prior Publication Data

US 2002/0022388 A1 Feb. 21, 2002

(30) Foreign Application Priority Data

Aug. 8, 2000 (JP) ..................... 2000-239870

(51) Int. Cl.[7] ................................. H01R 9/09
(52) U.S. Cl. ..................... 439/76.2; 439/67
(58) Field of Search .................. 439/76.2, 949, 439/850, 852, 76.1, 62; 361/748, 749

(56) References Cited

U.S. PATENT DOCUMENTS

| | | | |
|---|---|---|---|
| 4,831,278 A | * 5/1989 | Ueda et al. ............... 307/10.1 |
| 4,895,524 A | * 1/1990 | Thepault ................... 361/749 |
| 5,249,973 A | 10/1993 | Fujita et al. | |
| 5,478,244 A | * 12/1995 | Maue et al. ............... 361/752 |
| 5,895,277 A | 4/1999 | Saka et al. | |
| 6,118,666 A | * 9/2000 | Aoki et al. ............... 361/749 |
| 6,137,054 A | * 10/2000 | Uezono et al. ........... 174/59 |

FOREIGN PATENT DOCUMENTS

| | | |
|---|---|---|
| EP | 727841 | 8/1996 |
| EP | 793249 | 9/1997 |
| JP | 1-202109 | 8/1989 |
| JP | 6-120642 | 4/1994 |
| JP | 6-296317 | 10/1994 |

OTHER PUBLICATIONS

An English Language abstract of JP 1–202109.
An English Language abstract of JP 1–120642.
An English Language abstract of JP 6–296317.

* cited by examiner

Primary Examiner—Neil Abrams
Assistant Examiner—Phuong K T Dinh
(74) Attorney, Agent, or Firm—Greenblum & Bernstein, P.L.C.

(57) ABSTRACT

An electrical connector housing includes a first shell, the top face of which carries connector mounts, fuse mounts and relay mounts. It further includes a second shell, the bottom face of which carries second connector mounts. The second shell is then fitted to the first shell. The electrical connector housing contains a bus bar stack, first and second flexible printed boards and a printed board. The first and second flexible printed boards are superposed to each other in the electrical connector housing, so that the copper foil patterns contained therein can be electrically connected by welding.

10 Claims, 6 Drawing Sheets

ELECTRICAL CONNECTOR HOUSING

BACKGROUND OF THE INVENTION

1. Field of the Invention

The present invention generally pertains to an electrical connector housing to be mounted in a vehicle e.g., a car (automobile). In particular, the invention aims at providing a scaled-down and lighter electrical connector housing better suited to the increasing demand for applications in small sized vehicles.

2. Description of Background Information

Electrical devices such as relays, fuses and connectors for vehicles are typically housed in an electrical connector housing, and mounted in a vehicle. In the bus bar-containing housings of the prior art, these electrical devices are electrically connected through connecting circuits formed of bus bars.

In such a housing, a plurality of bus bars are laminated with insulator materials, so as to form a bus bar stack. The latter forms the connecting circuits for the electric devices. More particularly, the above connector housing contains a bus bar stack that is composed of a variety of relay-connecting circuits, fuse-connecting circuits and connector-connecting circuits.

Recent years have been marked by the tendency for miniaturizing and lightening vehicles. As a result, the space for mounting electrical connector housings has become limited, and there is now an urgent need to construct smaller and lighter electrical connector housings. However, in the known housings, all connecting circuits are formed into a bus bar stack, which is made by laminating in alternating fashion several layers of bus bars and insulator sheets. Moreover, as required by currently available molding technology, the bus bars require a certain degree of thickness and width. Likewise, the insulator material also requires a certain degree of thickness. It is, however, difficult to miniaturize or lighten the bus bar stack in ways that allow a modification in bus bar wiring patterns or the number of laminates. The miniaturization or lightening of the electrical connector housings has thus encountered a hurdle difficult to get over.

SUMMARY OF THE INVENTION

The present invention was made under such a context, and has an object of miniaturizing the size and reducing the weight of an electrical connector housing to be mounted in a vehicle.

To this end, there is provided an electrical connector housing including a first shell carrying several types of electrical device mounts, and a second shell fitted thereto, the electrical connector housing containing a bus bar stack formed by laminating a group of bus bars and an insulator material.

In the above housing, several types of electrical device mounts are wired with corresponding connecting circuits, and the connecting circuits of at least one type of electrical device mounts are formed of a plurality of flexible printed boards each containing conductor patterns. Further, at least part of the plurality of flexible printed boards are superposed to one another and contained in the electrical connector housing.

Preferably, the several types of electrical device mounts include connector mounts, fuse mounts and/or relay mounts.

Preferably yet, the conductor patterns are electrically connected by welding.

Suitably, the conductor patterns allow a current up to 10 amperes to pass.

Typically, each of the conductor patterns has a thickness of about 0.1 mm and a width of about 2 mm.

Suitably, the plurality of flexible printed boards respectively include a plurality of connector pads, which are formed from part of the conductor pattern in a locally concentrated manner and electrically connected by welding, such that the plurality of flexible printed boards can be connected electrically to one another.

According to a first embodiment of the invention, the connecting circuits, which are wired into electrical mounts, are formed of flexible printed boards. This structure renders the connecting circuits smaller and lighter compared to the structure made of a bus bar stack. Further, the connecting circuits may be formed by superposing a flexible printed board on the other, so as to form a multi-layered structure. Such a structure helps to form a compact connecting circuit structure in a limited space.

According to a second embodiment of the invention, the conductor patterns in each flexible printed board are electrically connected to one another by welding. They can thus be connected easily and reliably.

According to a third embodiment, only the connecting circuits which allow to pass a current up to 10 amperes are made of flexible printed boards.

BRIEF DESCRIPTION OF THE DRAWINGS

The above, and the other objects, features and advantages will be made apparent from the following description of the preferred embodiments, given as non-limiting examples, with reference to the accompanying drawings, in which.

DETAILED DESCRIPTION OF THE PREFERRED EMBODIMENTS

Figure 1:
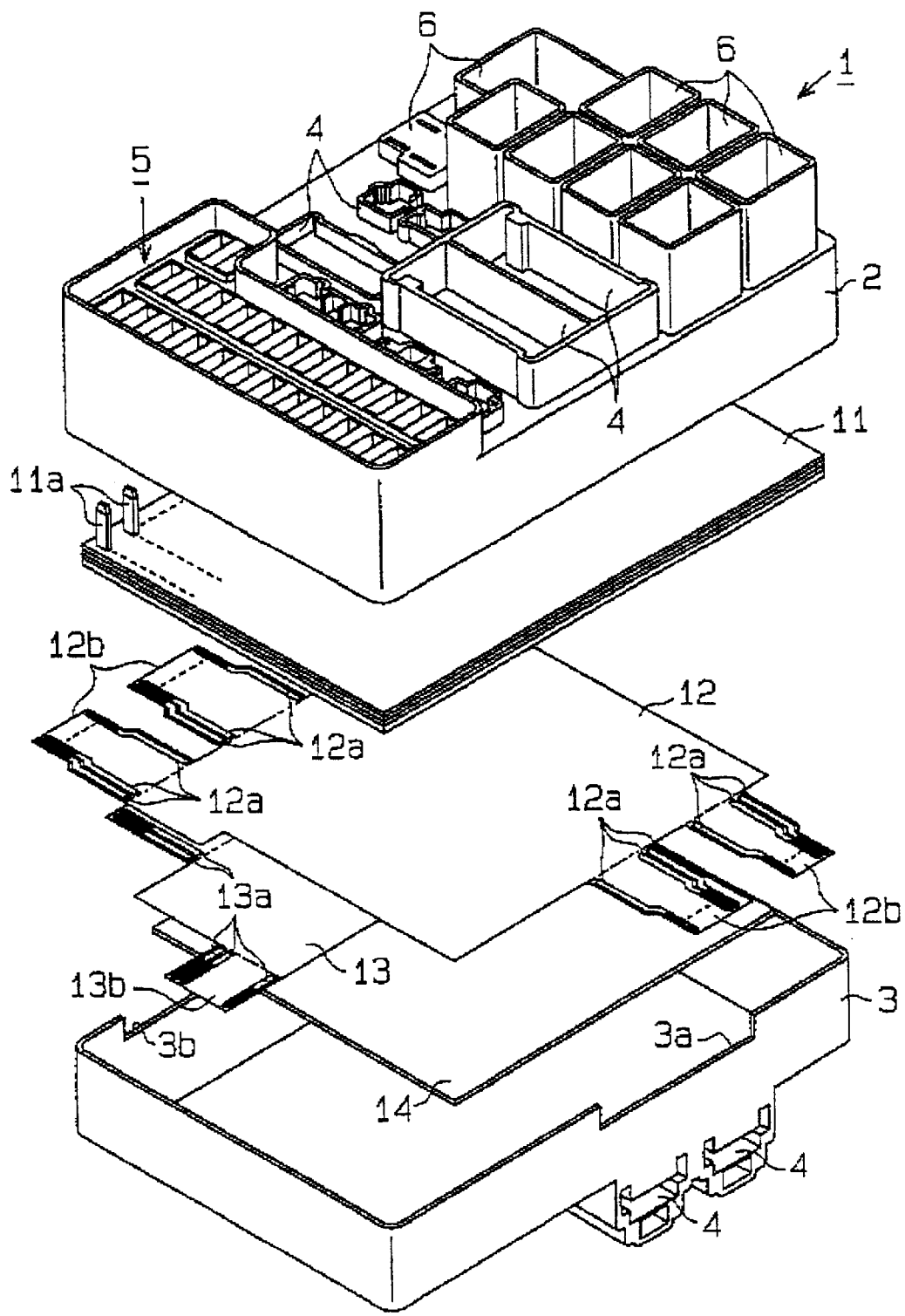
FIG. 1 is a perspective view of the electrical connector housing of the invention before having been assembled.

As shown in FIG. 1, an electrical connector housing according to preferred embodiments of the invention includes a first shell 2 (top shell in the figure) and a second shell 3 (bottom shell, ibid.). The external (top) face of the first shell 2 is provided with a plurality of connector mounts 4, of fuse mounts 5, and of relay mounts 6. All of the connector, fuse and relay mounts 4, 5 and 6 are freely engageable with, and removable from, respective connectors, fuses and relays which are introduced from above the external face of the first shell 2. Further, the external face of the second shell 3 is provided with second connector mounts 4. The latter 4 are freely engageable with, or removable from, corresponding connectors brought from below the external face of the second shell 3. The first and second shells 2 and 3 are fitted to each other, so as to form an inside space.

The electrical connector housing 1 of the present embodiments contains a bus bar stack 11, a first flexible printed board 12, a second flexible printed board 13 and a printed board 14.

The bus bar stack 11 is formed by laminating in alternating fashion a plurality of bus bars each made of a given shape of conductor metallic material, and an insulator material made of a synthetic resin. The upper face of the bus bar stack 11 is provided with a plurality of bus bar terminals 11a projecting upwardly therefrom. These terminals 11a are formed by bending a part of each of bus bars constituting the bus bar stack 11. They are formed at the positions corresponding to respective connector, fuse and relay mounts 4, 5 and 6 provided on the first shell 2.

Figure 2A:
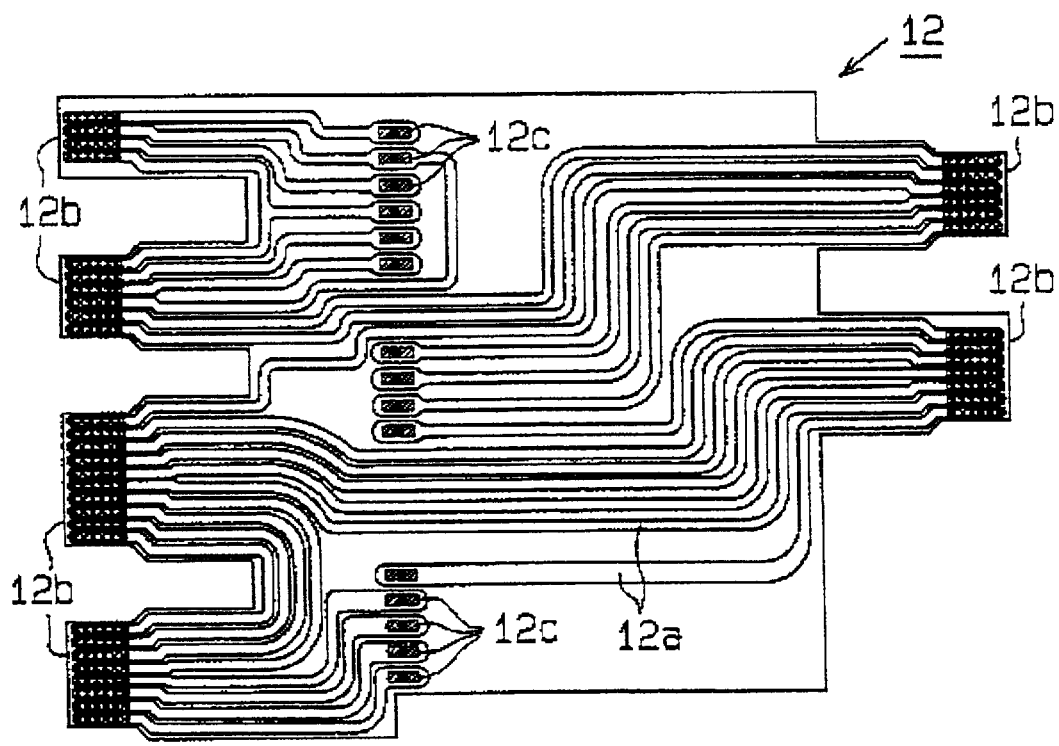
FIG. 2A is a top plan view of a first flexible printed board contained in the electrical connector housing of the invention.
Figure 2B:
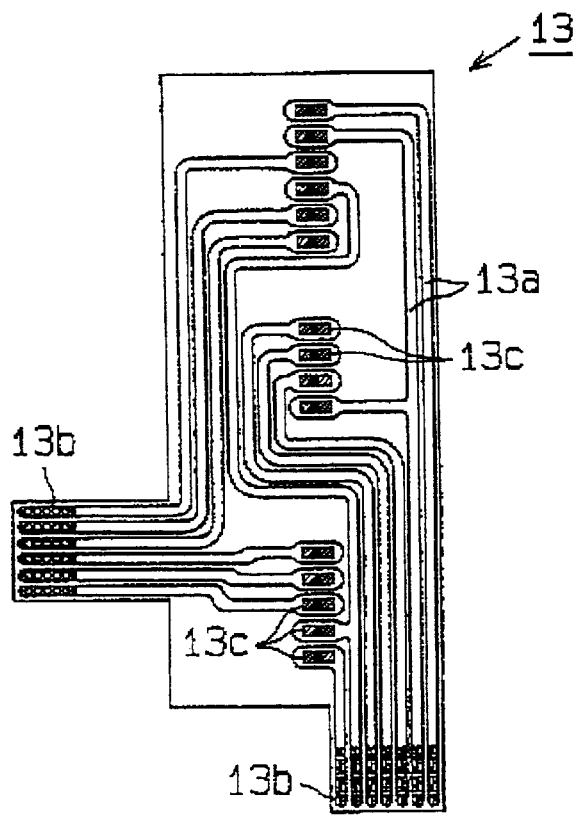
FIG. 2B is a top plan view of a second flexible printed board contained in the electrical connector housing of the invention.
Figure 3:
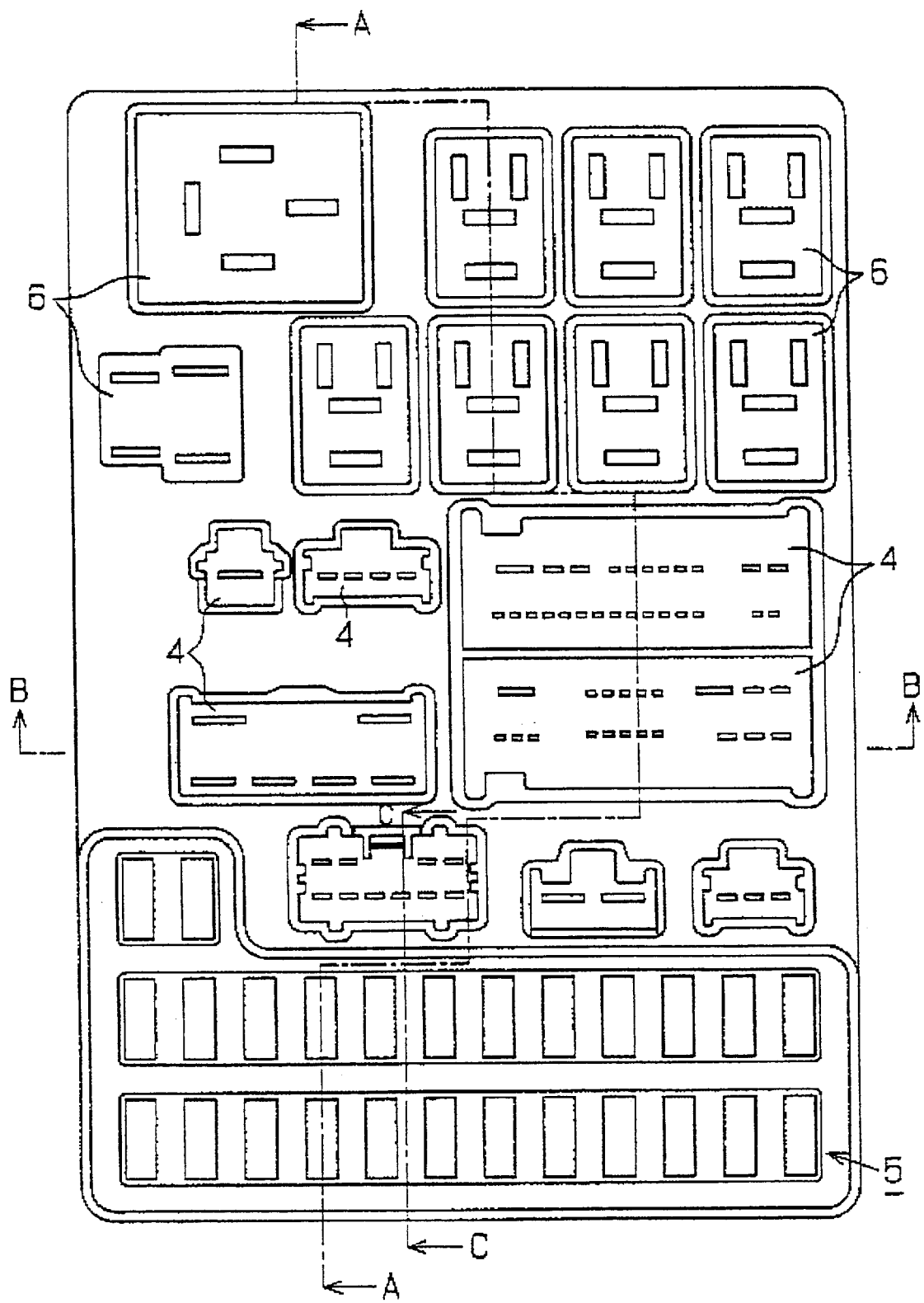
FIG. 3 is a top plan view of the inside of the electrical connector housing of the invention.
Figure 4:
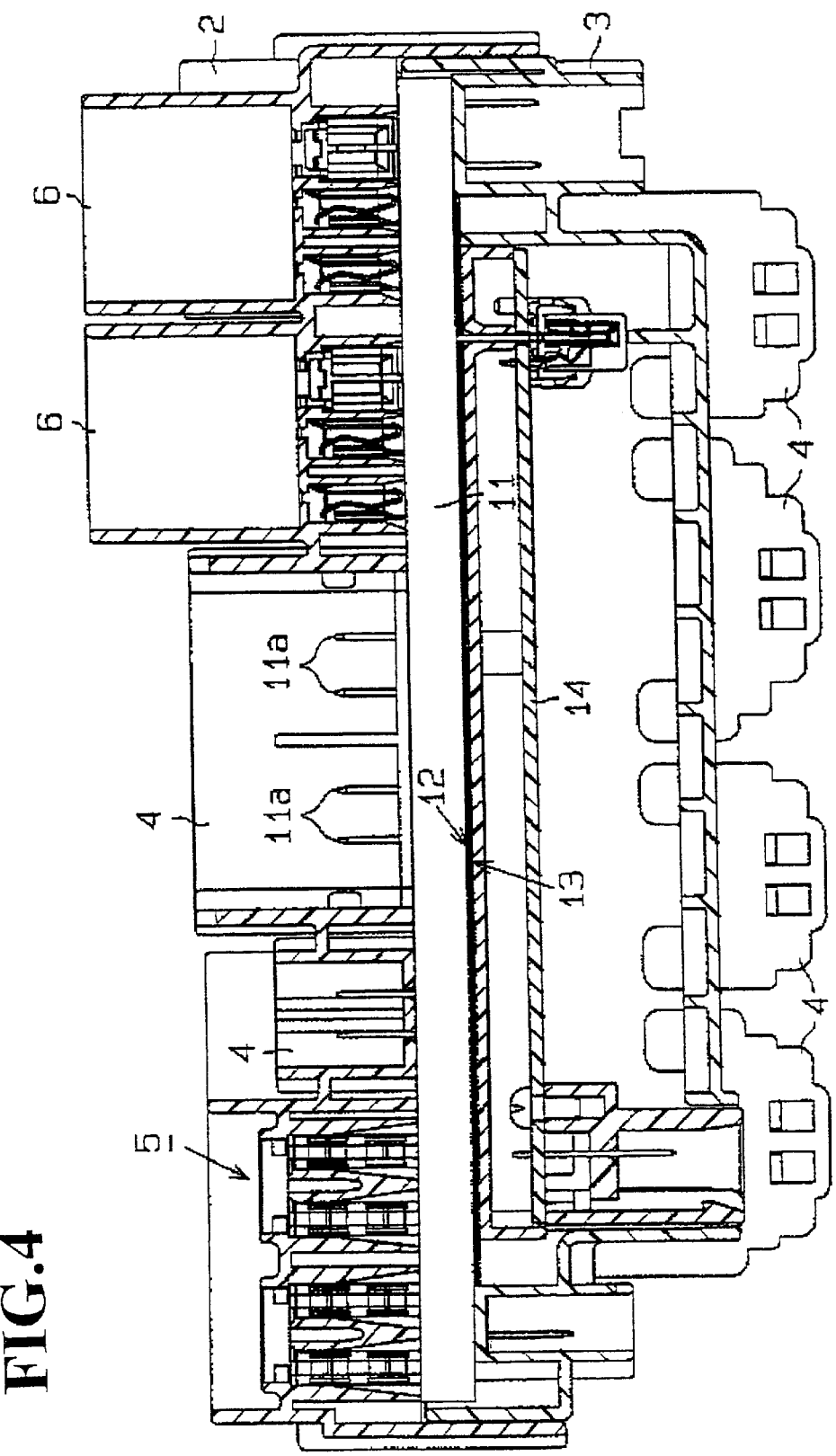
FIG. 4 is a cross-sectional view along line A—A of the electrical connector housing of FIG. 3.
Figure 5:
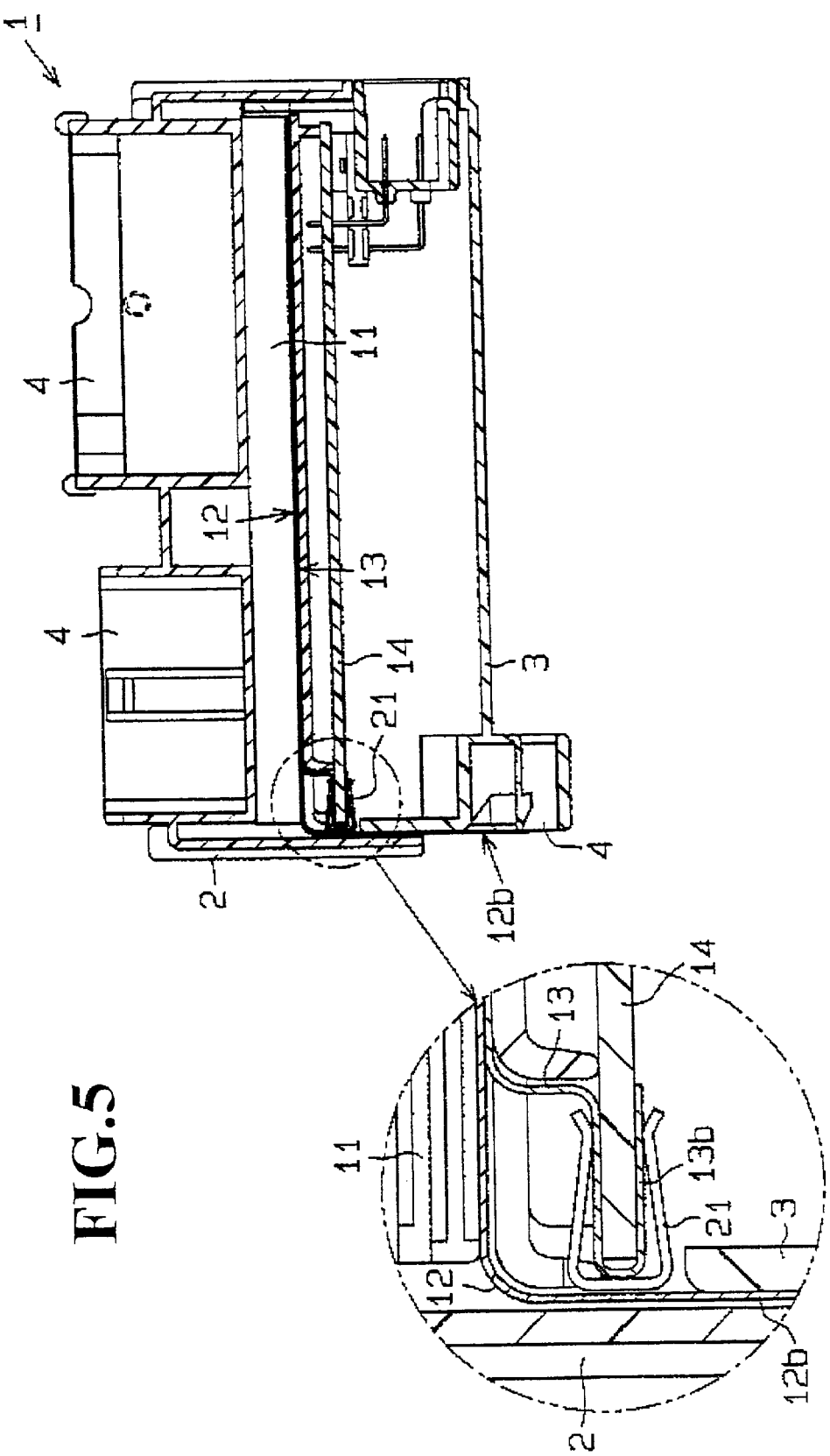
FIG. 5 is a cross-sectional view along line B—B of the electrical connector housing of FIG. 3.

As shown in FIG. 2, the first and second flexible printed boards 12 and 13 are respectively formed by coating copper foil patterns 12a and 13a of given shape, with resin sheets. The second flexible printed board 13 is made smaller than the first flexible printed board 12. As shown in FIGS. 3 to 5, the first and second flexible printed boards 12 and 13 are superposed to each other, so as to form a double-layered structure. FIGS. 4 and 5 schematically show the structure of the bus bar stack 11.

Given positions on each of the flexible printed boards 12 and 13 are provided respectively with a group of connector terminals 12b and 13b. Each connector terminal 12b or 13b is made of a copper foil which constitutes a copper foil pattern 12a or 13a. One face of each connector terminal 12b or 13b is stripped of the insulator sheet, so that part of the copper foil pattern 12a or 13a is exposed.

Likewise, given positions on each flexible printed board 12 or 13 are provided respectively with a plurality of connector pads 12c or 13c. The latter are formed by stripping off part of the insulator sheet covering the copper foil patterns 12a and 13a. Namely, each connector pad 12c or 13c is formed of part of a copper foil pattern 12a or 13a exposed from the surface of the flexible printed board 12 or 13. The connector pads 12c or 13c are typically arranged in parallel along a straight line. In other words, the connector pads 12c or 13c are formed in a locally-concentrated manner. To do this, the copper foil patterns 12a and 13a in each flexible printed board 12 or 13 are arranged so that the connector pads 12c and 13c can be formed along a straight line.

Then, the corresponding connector pads 12c or 13c are electrically connected to one another e.g., by ultrasonic welding. In the above embodiment, each copper foil pattern 12a or 13a is about 0.1 mm thick and about 2 mm wide, so that it can pass a maximum current of 10 Amperes.

In the above bus bar stack and flexible printed board structure, the bus bar stack 11, the first flexible printed board 12 and the second flexible printed board 13 are placed in the mentioned order from top (first shell side) to bottom (second shell side) in the electrical connector housing 1. In the above configuration, the first and second flexible printed boards 12 and 13 are arranged adjacent the face of bus bar stack 11 where no bus bar terminal 11a is formed. Further, a printed board 14 is arranged below the second flexible printed board 13. The printed board 14 functions as an "ECU" unit which performs electronic controls over the engine. It includes therefore various kinds of electronic components such as CPU and ROM.

As shown in FIG. 1, the second shell 3 has side walls which are notched from the upper end so as to form a recess 3a or 3b. The first flexible printed board 12 is placed in the second shell 3, so that the connector terminals 12b are placed in the recess 3a or 3b. As shown in FIG. 5, when the first and second shells 2 and 3 are fitted, the connector terminals 12b are bent by the corresponding walls of the shells 2 and 3, and clamped therebetween. In this manner, the connector terminals 12b are arranged in the corresponding connector mounts 4. In such a construction, each of the first and second flexible printed boards 12 and 13 forms part of the connector-connecting circuits, which are linked to the connectors mounted into the connector mounts 4.

Further, as shown in FIG. 5, at least one of the connector terminals 13b in the second flexible printed board 13 is bent so as to be placed into contact with the conductor patterns wired on the printed board 14. The connector terminals 13b and the printed board 14 are then clamped by connecting clips 21, so that the connector terminals 13b and the conductor patterns on the printed board 14 are electrically connected.

Figure 6:
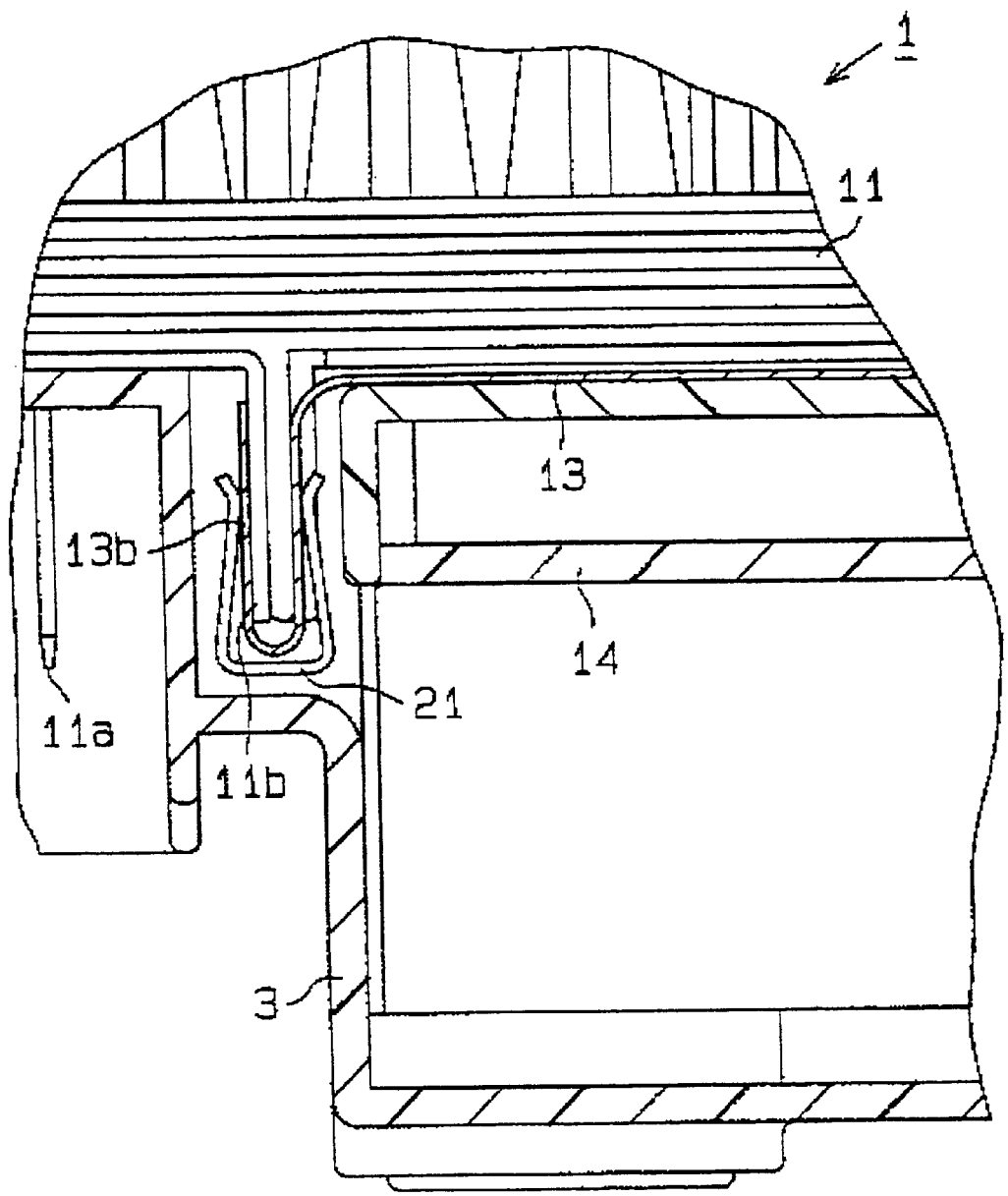
FIG. 6 is a cross-sectional view along line C—C of the electrical connector housing of FIG. 3.

As shown in FIG. 6, at least one of the connector terminals 13b of the second flexible printed board 13 is bent, so that it can be placed into contact with one or several board connectors 11b formed in the bus bar stack 11. The above board connector 11b is formed by bending downwardly part of a bus bar of the bus bar stack 11. Such bus bars are therefore formed at the positions corresponding to the copper foil patterns 13a of the connector terminals 13b. Further, the connector terminals 13b and the board connectors 11b are clamped by connecting clips 21, so that the second flexible printed board 13 and the bus bar stack 11 are electrically connected.

The technical effects brought about by the above embodiments of the invention can be summarized as follows.

As the connector circuits wired into the connector mounts 4 are formed of the first and second flexible printed boards 12 and 13, their structure is small and light, compared to the structure with a bus bar stack 11. Further, the connector circuits form a multi-layered structure made by superposing several flexible printed boards, e.g., flexible printed boards 12 and 13. It is now thus possible to make small-area circuits, compared to a single layered structure, and to configure the circuits in a limited space. Further, its production costs less than for a flexible printed board including two layered copper foil patterns. Soaring of the cost for the production of electrical connector housings 1 can thus be avoided.

Further, the copper foil patterns 12a and 13a of the respective flexible printed boards 12 and 13 are electrically connected by welding the respective connector pads 12c and 13c. Thus, the respective copper foil patterns 12a and 13a can be connected to each other very easily and very firmly.

Furthermore, in each flexible printed board 12 or 13, the copper foil patterns 12a or 13a are made to be about 0.1 mm thick and about 2 mm wide, so that they can pass a maximum current of 10 Amperes. Typically, their thickness is 0.035 mm. Accordingly, even when the copper foil patterns are set at their maximum 10-Ampere capacity with 0.1 mm-thickness, the width of the patterns remains quite narrow. The area of the flexible printed boards 12 and 13 can thus be kept small.

However, the invention is not limited to the above embodiments. For instance, the connector pads 12c and 13c on the flexible printed boards 12 and 13 need not be arranged along a straight line. The copper foil patterns 12a and 13a can then be configured more freely.

Further, the electrical connector housing 1 may contain more than two layers of flexible printed boards, instead of the two-layer structure (flexible printed boards 12 and 13) as exemplified above.

The connector pads 12c and 13c may be connected e.g., by resistance welding or laser welding, instead of ultrasonic welding. They can also be connected by soldering with "cream" solder.

Further, the flexible printed boards 12 and 13 need not be connected to each other electrically, contrary to the above embodiments.

The thickness and width of the copper foil patterns 12a and 13a may be modified so as to pass a current of over 10 Amperes. Conversely, they may be modified to lower the maximum current to less than 10 Amperes.

The second flexible printed board 13, the printed board 14 and the bus bar stack 11 may be connected by welding, instead of using the connecting clips 21.

The printed board 14 may be placed outside the electrical connector housing 1, instead of inside the latter.

The flexible printed boards 12 and 13 may be placed above the bus bar stack 11, instead of below the bus bar stack 11. In such case, the boards 12 and 13 are preferably placed in the area where no bus bar terminal 11a is formed.

As in the case of the connector-connecting circuits, part of the fuse-connecting circuits and/or the relay-connecting circuits may be formed of the flexible printed boards 12 and 13.

Although the first shell 2 is placed above the second shell 3 in the above examples, their positions may be reversed when they are mounted in a vehicle. They may also be mounted in a turned-down state, e.g. in a 90° inclined state, such that a side wall of the first and second shells 2 and 3 is placed on the top side in the vehicle. The electrical connector housing 1 may thus be oriented to any direction.

As can be understood from the foregoing, the main concept of the invention may be summarized as follows.

The electrical connector housing of the invention contains two flexible printed boards.

Its electrical device mounts include connector mounts, into which connector-connecting circuits are wired. Part of these connector-connecting circuits is formed of a flexible printed board.

The electrical connector housing includes first and second shells. The first shell includes several kinds of electrical device mounts, and the second shell is fitted to the first shell. The housing contains a bus bar stack formed by laminating bus bars and insulator materials. Each kind of electrical device mounts is wired to corresponding connecting circuits. The latter are formed of several flexible printed boards, and these boards are contained in the electrical connector housing in an electrically connected state.

Although the invention has been described with reference to particular means, materials and embodiments, it is to be understood that the invention is not limited to the particulars disclosed and extends to all equivalents within the scope of the claims.

The present disclosure relates to subject matter contained in priority Japanese Patent Application No.2000-239870, filed on Aug. 8, 2000, which is herein expressly incorporated by reference in its entirety.

What is claimed:

1. An electrical connector housing comprising a first shell having several types of electrical device mounts, including connector mounts, fuse mounts and relay mounts, and a second shell fitted to the first shell, the electrical connector housing containing a bus bar stack formed by laminating a group of bus bars and an insulator material;

said several types of electrical device mounts being wired with corresponding connecting circuits;

said connecting circuits of at least one type of electrical device mounts being formed of a plurality of superposed flexible printed boards contained in the electrical connector housing, each of said flexible printed boards including conductor patterns and connector terminals, wherein said conductor patterns of said flexible printed boards are electrically connected, and said connector terminals of said flexible printed boards are bent by corresponding walls of the first and second shells and arranged in corresponding ones of the electrical device mounts.

2. The electrical connector housing according to claim 1, wherein said conductor patterns allow a current up to 10 Amperes to pass.

3. The electrical connector housing according to claim 1, wherein each of said conductor patterns has a thickness of about 0.1 mm and a width of about 2 mm.

4. The electrical connector housing according to claim 1, wherein said plurality of flexible printed boards respectively comprise a plurality of connector pads, which are formed from part of said conductor pattern in a locally concentrated manner, such that said plurality of flexible printed boards can be connected electrically to one another.

5. The electrical connector housing according to claim 2, wherein said plurality of flexible printed boards respectively comprise a plurality of connector pads, which are formed from part of said conductor pattern in a locally concentrated manner, such that said plurality of flexible printed boards can be connected electrically to one another.

6. The electrical connector housing according to claim 3, wherein said plurality of flexible printed boards respectively comprise a plurality of connector pads, which are formed from part of said conductor pattern in a locally concentrated manner, such that said plurality of flexible printed boards can be connected electrically to one another.

7. The electrical connector housing according to claim 1, wherein the connector terminals bent by the corresponding walls of the first and second shells are clamped between the corresponding walls of the first and second shells.

8. The electrical connector housing according to claim 1, wherein at least one of the first and second shells includes a side wall having a recess in which one of said connector terminals of one of said flexible printed boards is received.

9. The electrical connector housing according to claim 7, wherein at least one of the first and second shells includes a side wall having a recess in which one of said connector terminals of one of said flexible printed boards is received.

10. The electrical connector housing according to claim 1, wherein said conductor patterns are electrically connected by welding.

* * * * *